United States Patent
Gallagher et al.

(10) Patent No.: US 7,068,396 B1
(45) Date of Patent: Jun. 27, 2006

(54) METHOD AND APPARATUS FOR PERFORMING TONE SCALE MODIFICATIONS ON A SPARSELY SAMPLED EXTENDED DYNAMIC RANGE DIGITAL IMAGE

(75) Inventors: Andrew C. Gallagher, Brockport, NY (US); Edward B. Gindele, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 1204 days.

(21) Appl. No.: 09/718,991

(22) Filed: Nov. 21, 2000

(51) Int. Cl.
H04N 1/40 (2006.01)
(52) U.S. Cl. ..................... 358/3.01; 348/272; 348/294; 250/208.1
(58) Field of Classification Search ................ 382/274; 348/222.1, 222.9, 362, 294, 272, 273; 250/208.1; 358/3.01, 3.21
See application file for complete search history.

(56) References Cited

U.S. PATENT DOCUMENTS

| | | | |
|---|---|---|---|
| 3,971,065 A | 7/1976 | Bayer | |
| 4,667,092 A | 5/1987 | Ishihara | |
| 4,731,671 A | 3/1988 | Alkofer | |
| 4,945,406 A | 7/1990 | Cok | |
| 5,012,333 A | 4/1991 | Lee et al. | |
| 5,189,511 A | 2/1993 | Parulski et al. | |
| 5,221,848 A | 6/1993 | Milch | |
| 5,300,381 A | 4/1994 | Buhr et al. | |
| 5,652,621 A | 7/1997 | Adams, Jr. et al. | |
| 5,822,453 A | 10/1998 | Lee et al. | |
| 6,275,605 B1 * | 8/2001 | Gallagher et al. | 382/162 |
| 6,418,245 B1 * | 7/2002 | Udagawa | 382/312 |
| 6,580,835 B1 * | 6/2003 | Gallagher et al. | 382/274 |
| 6,594,388 B1 * | 7/2003 | Gindele et al. | 382/167 |
| 6,636,646 B1 * | 10/2003 | Gindele | 382/274 |

FOREIGN PATENT DOCUMENTS

| | | |
|---|---|---|
| EP | 0 377 386 A2 | 7/1990 |
| EP | 0 667 718 A2 | 8/1995 |
| EP | 0 713 342 A2 | 5/1996 |
| EP | 1 014 687 A2 | 6/2000 |
| EP | 1 021 032 A2 | 7/2000 |

OTHER PUBLICATIONS

U.S. Appl. No. 09/615,398, filed Jul. 13, 2000 by Gallagher et al.
U.S. Appl. No. 09/707,635 filed Nov. 7, 2000 by Gindele et al.

(Continued)

Primary Examiner—Thomas D. Lee
(74) Attorney, Agent, or Firm—Thomas H. Close

(57) ABSTRACT

A method of generating a tone scale function for a sparsely sampled extended dynamic range digital image, includes the steps of: providing a sparsely sampled extended dynamic range image sensing device having fast photosites with a predetermined response to light exposure interspersed with slow photosites with a slower response to the same light exposure; using the image sensing device to produce a sparsely sampled high resolution digital image having fast pixel values produced by the fast photosites and slow pixel values produced by the slow photosites; and generating the tone scale function using only slow pixel values from the sparsely sampled high resolution digital image.

78 Claims, 9 Drawing Sheets

OTHER PUBLICATIONS

U.S. Appl. No. 09/718,8887 filed concurrently by Gallagher et al.
U.S. Appl. No. 09/707,673 filed Nov. 7, 2000 by Gindele et al.
U.S. Appl. No. 09/718,882 filed concurrently by Gindele et al.
U.S. Appl. No. 09/163,645 filed Sep. 30, 1998 by Gallagher et al.

* cited by examiner

METHOD AND APPARATUS FOR PERFORMING TONE SCALE MODIFICATIONS ON A SPARSELY SAMPLED EXTENDED DYNAMIC RANGE DIGITAL IMAGE

FIELD OF THE INVENTION

The invention relates generally to the field of image capture, and more specifically to a method of performing tone scale modifications on an extended dynamic range digital image.

BACKGROUND OF THE INVENTION

Image sensing devices, such as a charge-coupled device (CCD), are commonly found in such products as digital cameras, scanners, and video cameras. These image sensing devices have a limited dynamic range when compared to traditional photographic film products. A typical electronic image sensing device has a dynamic range of about 7 stops. This means that the exposure for a typical scene must be determined with a fair amount of accuracy in order to avoid clipping the resultant signal. By contrast, natural scenes often exhibit a dynamic range of 9 stops and higher. This is mainly a consequence of multiple light sources with widely varying intensities illuminating the scene objects. Specular highlights also contribute to the dynamic range of natural scenes.

Electronic sensors used to scan photographic film must also contend with a high dynamic range of signal intensities. In U.S. Pat. No. 5,221,848 issued Jun. 22, 1993 to Milch entitled High Dynamic Range Film Digitizer and Method of Operating the Same discloses a method and apparatus designed to extend the dynamic range of an electronic image sensor. Intended primarily for scanning photographic film, the system described by Milch includes a one-pass film scanner using a charge-coupled device scanner having a plurality of linear arrays having the same spectral sensitivity. One of the arrays has a faster response to light than the other array. The information from the two arrays is then combined and digitized forming an extended dynamic range digital image.

Digital electronic cameras employ a single image sensor with a color filter array (CFA) to produce a sparsely sampled digital image. A typical color filter array pattern is disclosed in U.S. Pat. No. 3,971,065 issued Jul. 20, 1976 to Bayer entitled Color Imaging Array. Interpolation algorithms are employed to produce a full resolution color image from the sparsely sampled image. Digital cameras also need to record scenes having a high dynamic range. One way to obtain a high dynamic range image from a digital camera is to employ a high bit depth analog to digital converter in the camera. Another way is to employ an image sensor having interspersed fast and slow photosites as disclosed in copending U.S. Ser. No. 09/615,398 filed Jul. 13, 2000 by Gallagher et al. which is incorporated herein by reference.

It is known to employ a tone scale function that is specifically designed for use with extended dynamic range digital images. For example, U.S. Pat. No. 5,822,453 issued Oct. 13, 1998 to Lee et al. entitled Method for Estimating and Adjusting Digital Image Contrast discloses a method of calculating a tone scale function using the pixel values of an extended dynamic range digital image involving estimating the scene contrast from the digital image. However, the method taught by Lee et al. is not optimized for images that are captured by extended dynamic range image sensors having fast and slow photosites.

Therefore, there exists a need for an improved method of performing tone scale modifications on extended dynamic range images of the type that are captured by extended dynamic range image sensors having fast and slow photosites.

SUMMARY OF THE INVENTION

The need is met according to the present invention by providing a method of generating a tone scale function for a sparsely sampled extended dynamic range digital image that includes the steps of: providing a sparsely sampled extended dynamic range image sensing device having fast photosites with a predetermined response to light exposure interspersed with slow photosites with a slower response to the same light exposure; using the image sensing device to produce a sparsely sampled high resolution digital image having fast pixel values produced by the fast photosites and slow pixel values produced by the slow photosites; and generating the tone scale function using only slow pixel values from the sparsely sampled high resolution digital image.

According to one aspect of the invention, the tone scale function is applied to the sparsely sampled extended dynamic range digital image prior to interpolating the digital image to a full resolution digital image.

ADVANTAGES

The present invention has the advantage that the tone scale function is generated with a subset of pixel values thereby reducing the computation time for generating the tone scale function.

BRIEF DESCRIPTION OF THE DRAWINGS

FIG. 7A illustrates the arrangement of slow photosites and fast photosites on a panchromatic image sensing device;

FIG. 7B illustrates the arrangement of slow photosites and fast photosites on a color image sensing device;

DETAILED DESCRIPTION OF THE INVENTION

A digital image is comprised of a one or more digital image channels. Each digital image channel is comprised of a two-dimensional array of pixels. Each pixel value relates to the amount of light received by an imaging capture device corresponding to the geometrical domain of the pixel. For color imaging applications a digital image will typically consist of red, green, and blue digital image channels. Other configurations are also practiced, e.g. cyan, magenta, and yellow digital image channels. For monochrome applications, the digital image consists of one digital image channel. Motion imaging applications can be thought of as a time sequence of digital images. Those skilled in the art will recognize that the present invention can be applied to, but is not limited to, a digital image for any of the above mentioned applications.

Although the present invention describes a digital image channel as a two dimensional array of pixel values arranged by rows and columns, those skilled in the art will recognize that the present invention can be applied to mosaic (non rectilinear) arrays with equal effect. Those skilled in the art will also recognize that although the present invention describes replacing an original pixel value with processed pixel values, it is also contemplated to form a new digital image with the processed pixel values and retain the original pixel values.

Imaging devices employing electronic sensing devices are well known, therefore the present description will be directed in particular to elements forming part of, or cooperating more directly with, apparatus in accordance with the present invention. Elements not specifically shown or described herein may be selected from those known in the art. Note that as used herein, the term image is a two dimensional array of values. An image may be a two dimensional subset of another image. The present invention is preferably implemented using a programmed digital computer. The computer can be a general purpose computer, such as a personal computer, or a special purpose computer designed for image processing. It is within the ordinary skill of the programming art to produce a computer program for practicing the present invention based on the following disclosure.

Figure 1:
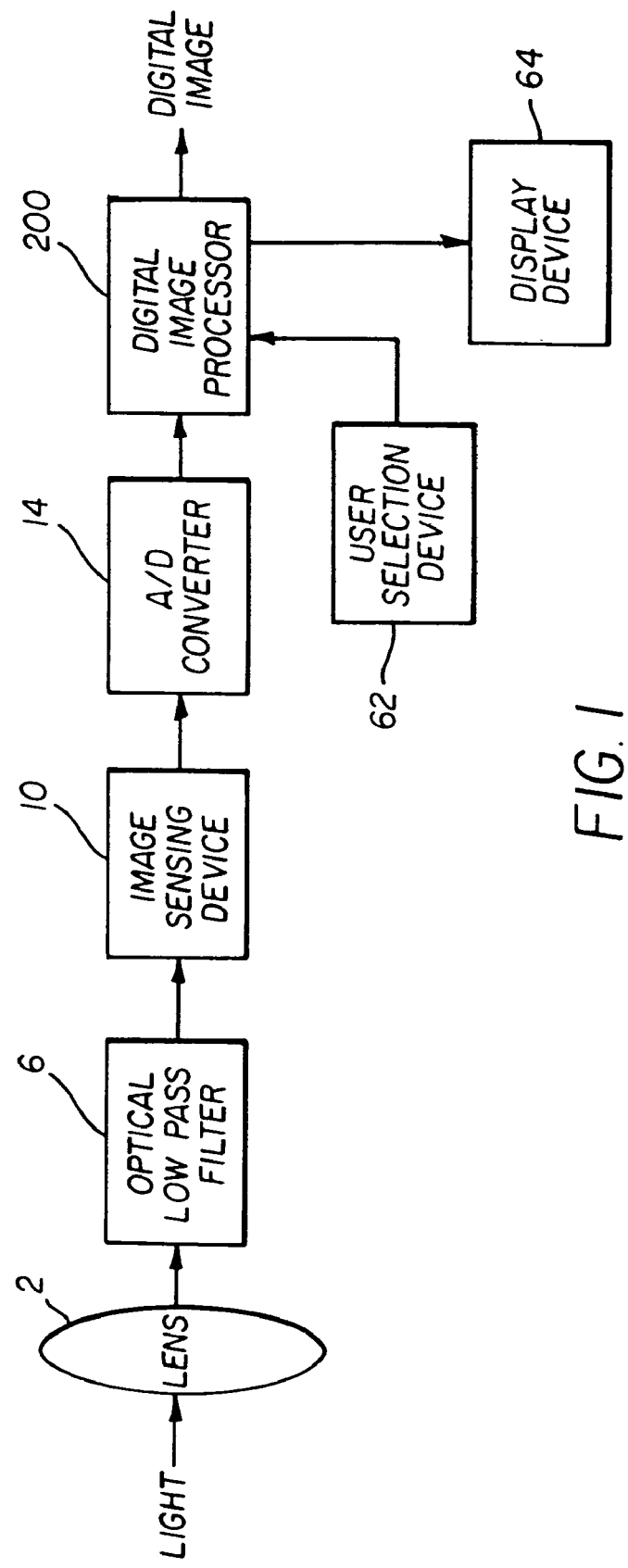
FIG. 1 is a block diagram of a digital imaging system utilizing an extended-range image sensing device and a digital image processor according to the invention.

The essential elements employed in the practice of the present invention are shown as a functional block diagram in FIG. 1. Light from an object or scene is incident upon a lens 2, forming a photographic image on an extended dynamic range image sensing device 10 such as a charged-coupled device (CCD) with a color filter array (CFA) having fast and slow photosites as described below. Note that other devices, such as CMOS devices, may be used as the image sensing device 10. The image sensing device 10 is a sparsely sampled, extended dynamic range image sensing device as will be described in further detail below. An optical low pass filter 6 placed between the lens 2 and the image sensing device 10, performs a slight blurring of the imaged light in order to reduce the occurrence of aliasing. An A/D converter 14 receives the voltage signal corresponding to the imaged light from the image sensing device 10 and produces an image signal corresponding to the voltage signal. The digital image processor 200 receives the image signal from the A/D converter 14, modifies the image signal and produces a digital image. As noted above, the digital image processor 200 can be a programmed personal computer, or a special purpose image processor. The user of the digital imaging system can make selections, with a user selection device 62 such as a keyboard, mouse, or button on a camera body, with regard to the tonal appearance of an image. For example, the user may view an image created with a certain tone scale function on a display device 64. The user may then specify a desired tone scale adjustment. For example, this desired tone scale adjustment may be specified by the user indicating with the user selection device 62 that the shadows should be lightened. An adjusted tone scale function is then created using the desired tone scale adjustment. Creating and modifying a tone scale function based on desired tone scale adjustments from a user is well known in the art of image processing. For example, commonly assigned U.S. Pat. No. 5,012,333 by Lee et al. describes an interactive method for generating a tone scale function and applying the function to an image. The present invention can also be implemented within a digital camera. For this digital imaging system application, an enhanced digital image derived from a low resolution digital image is displayed on a display device 64, for example a liquid crystal display device (LCD) as a component of the digital camera. Alternatively, the present invention can be practiced in a film or reflection scanner or other device that produces an extended dynamic range digital image.

The A/D converter 14 shown in FIG. 1 converts the voltage signal produced by the image sensing device 10 into an image signal, i.e. a stream of digital pixel values corresponding to the voltage signal produced by the photosites of the image sensing device 10. More specifically, the A/D converter 14 converts the voltage signal, nearly linear with respect to the intensity of the incident light, from the image sensing device 10 to a discrete digital image signal, e.g. a 10 bit signal where the linear encoded values range from 0 to 1023. The A/D converter 14 may also perform processing to convert the linear code value domain image signal to a nonlinear code value domain image signal, such as an 8 bit logarithmic signal as is commonly performed in the art. For example, the following equation can be used to convert a 10 bit linear image signal a(x,y), where (x,y) specifies the row and column index of the signal location with reference to the image sensing device 10, into an 8 bit logarithmic image signal b(x,y):

$$b(x, y) = \begin{cases} 0 & 0 \le a(x, y) \le 31 \\ 73.5975 \ln a(x, y) - 255 & 32 \le a(x, y) \le 1024 \end{cases} \quad (1)$$

Note that each stop of exposure (in the linear response region of the image sensing device) results in a doubling of the linear image signal a(x,y) and results in an increase of the logarithmically encoded image signal b(x,y) by 51. In this case, the value 51 represents the number of code values per stop (cvs) of exposure.

Figure 2:
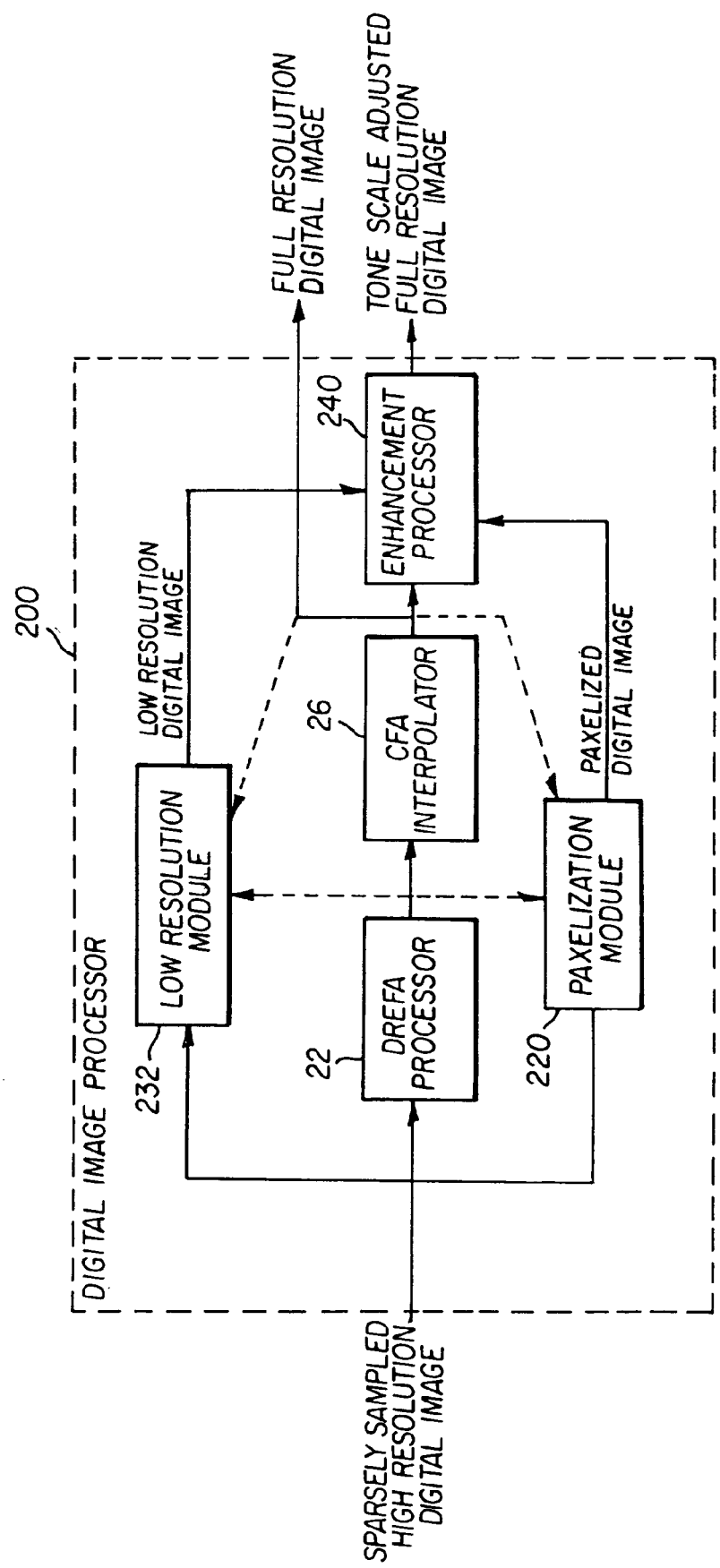
FIG. 2 is a functional block diagram of the digital image processor.

The digital image processor 200 shown in FIG. 1 is illustrated in more detail in FIG. 2. The image signal is received by the dynamic range extending filter array (DREFA) processor 22. The DREFA processor 22 processes the sparsely sampled high resolution digital image output from the A/D converter 14 by expanding the dynamic range of the image and interpolating the sample values. The DREFA processor 22 then transmits the modified image signal to the CFA interpolator 26 where the color values are interpolated to provide a color value at each pixel. The output of the CFA interpolator 26 is a full resolution digital image. The paxelization module 220 also receives the sparsely sampled high resolution digital image and produces a paxelized digital image, i.e. a low resolution digital image derived from the image signal. Optionally, the high resolution digital image is also received by an enhancement processor 240 which receives the paxelized digital image, calculates enhancements based on the paxelized digital image and applies the enhancements to the pixels of the high resolution digital image to generate an enhanced digital image.

The purpose of the CFA interpolator 26 is to generate a full description of the color for each location of the sensed photographic image. In the preferred embodiment, the image sensing device 10 consists of an array of photosensitive elements called photosites. Each photosite is typically provided with either a red, green, or blue filter, as described by Bayer in commonly assigned U.S. Pat. No. 3,971,065, which is incorporated herein by reference. The Bayer array is a color filter array in which green filters are located in a checkerboard pattern over the photosites with red and blue filters alternating line by line to fill the interstices of the checkerboard pattern; this produces twice as many green filter sites as either red or blue filter sites. Note that the method described herein may be easily extended to color filter arrays with different arrangements of the primaries, a different number of primaries, or a different set of primaries. Thus, in the preferred embodiment, each photosite is sensitive to either red, green, or blue light. However, it is desirable to obtain a pixel value corresponding to an exposure for each of the red, green, and blue exposures at each photosite location. The pixel values of the sparsely sampled high resolution digital image output from the A/D converter 14 constitute a sparsely sampled image having red, green, and blue pixel values at neighboring pixel locations.

In this description, "red", "green", and "blue" represent the primary spectral sensitivities of an image sensing device 10, as is well known in the art of image processing. The CFA interpolator 26 generates from the image signal output from the A/D converter 14 an interpolated image signal consisting of a pixel value corresponding to the color primaries for each photosite. For example, if a particular photosite is coated with a red filter, then the A/D converter 14 outputs a red pixel value for that photosite since the red filter essentially blocks green and blue light from that particular photosite. The CFA interpolator 26 calculates a green pixel value and blue pixel value for the corresponding photosite even though the corresponding photosite does not respond to green and blue light. Similarly, the CFA interpolator 26 calculates a green pixel value and a red pixel value corresponding to the blue photosites, as well as a red pixel value and blue pixel value corresponding to the green photosites. The operation of the CFA interpolator 26 can be combined with the DREFA processor 22. Conceptually, the CFA interpolator 26 and the DREFA processor 22 perform distinct operations and for the purpose of clarity are not combined in this embodiment.

Generally, the CFA interpolator 26 operates by considering the pixel values of the corresponding photosite and the pixel values of associated surrounding photosites. While any commonly known interpolator may be used, a description of a preferred CFA interpolator is disclosed in. U.S. Pat. No. 5,652,621 issued Jul. 29, 1997 to Adams et al. entitled Adaptive Color Plane Interpolation in Single Sensor Color Electronic Camera, which is incorporated herein by reference. Adams et al. describe an apparatus for processing a digitized image signal obtained from an image sensor having color photosites aligned in rows and columns that generate at least three separate color values but only one color value for each photosite location, and a structure for interpolating color values for each photosite location so that it has three different color values. The apparatus generates an appropriate color value missing from a photosite location by the interpolation of an additional color value for such photosite locations from color values of different colors than the missing color value at nearby photosite locations. The apparatus also obtains Laplacian second-order values, gradient values and color difference bias values in at least two image directions from the pixel values corresponding to nearby photosites of the same column and row and selects a preferred orientation for the interpolation of the missing color value based upon a classifier developed from these values. Finally, the missing color pixel value from nearby multiple color pixel values is selected to agree with the preferred orientation.

The sparsely sampled high resolution digital image output from the A/D converter 14 is received by the DREFA processor 22 which expands the dynamic range of the image signal to create a modified image signal having an expanded dynamic range. In the preferred embodiment, the dynamic range of the image sensing device 10 is expanded by designing certain photosites of the image sensing device 10 to have a slow response. The arrangement of the slow response photosites with respect to the image sensing device 10 will be discussed in greater detail hereinbelow. The responses of the slow response photosites are slowed, or retarded, by altering the gain of the selected photosites, herein referred to as slow photosites. Altering the gain of a photosite is commonly practiced in the art of digital camera design and manufacture.

Figure 3:
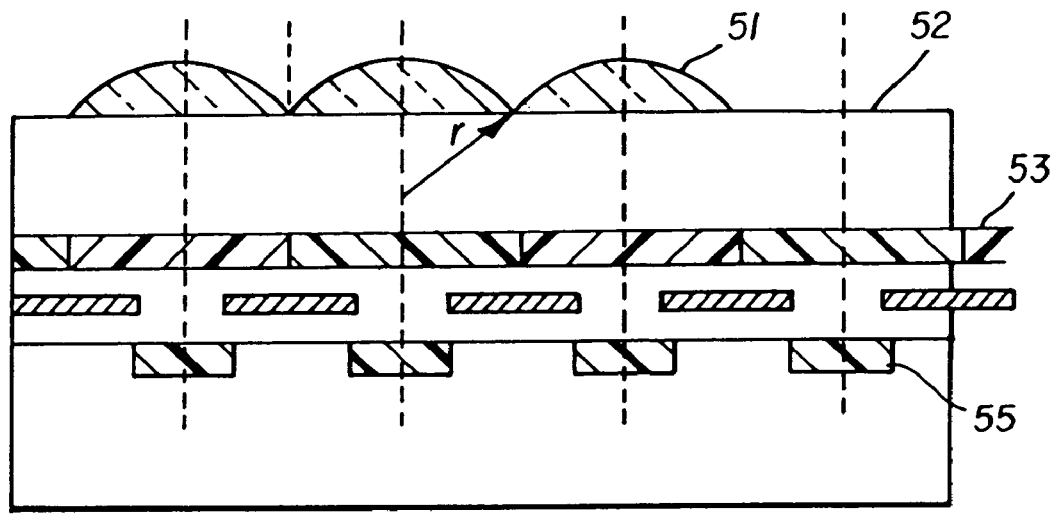
FIG. 3 is a cross-sectional view of an interline image sensing device employing an array of lenslets to alter the response of selected photosites.

With reference to FIG. 3, it is a common practice in the art of image sensor manufacture to place resin lenslets 51 on top of each photosite. For example, particularly when the image sensing device 10 is an interline solid state image sensing device, one such lenslet technique is described in U.S. Pat. No. 4,667,092 issued May 19, 1987 to Ishihara entitled Solid-State Image Device with Resin Lens and Resin Contact Layer, which is incorporated herein by reference. Ishihara discloses a solid-state image device which includes an image storage block having a block surface and a plurality of storage elements embedded along the block surface to store an image in the form of electric charge. An overlying layer is deposited to form an array of optical lenses in correspondence to the storage elements. An intermediate layer is laid between the block surface and the overlying layer. Incident light focuses through the lenses and the intermediate layer onto the storage elements. The intermediate layer serves as an adjusting layer for adjusting the focal length of the lenslets.

FIG. 3 shows a cross section of an interline solid state image sensing device. Without the lenslets 51, the signal readout area associated with each photosensitive area 55 of a photosite makes it impossible to use the whole area of the semiconductor substrate as the photoelectric transducer area. The conventional solid-state image device does not effectively utilize all incident rays thereon and therefore has low sensitivity. The addition of a resin lenslet 51 on top of a photosite allows the incident rays of light to be focused on the photoactive areas of the photosite, thereby more effectively utilizing the incident rays of light and increasing the sensitivity of the photosite. Thus, by varying the size and/or efficiency of the lenslet 51, the sensitivity (gain) of the photosite may be easily altered. Thus, for interline devices and for CMOS sensors the preferred method of altering the gain of the photosite is by altering the lenslet 51 placed on top of the photosite. As shown in FIG. 3, the location 52 has no lenslet, and therefore fewer incident rays of light are incident on the photosensitive area. Alternatively, a lenslet could be manufactured at location 52 with a different radius, shape, size or material as compared with the lenslet 51, thereby structured to be less efficient at focusing incident rays of light onto the photosensitive area 55 than is the lenslet 51. Those skilled in the art will recognize that if the lenslet 51 focuses 80% of the incident rays of light onto a photosensitive area 55 and the location 52 having no lenslets (or alternatively slow lenslets) allows 20% of the incident rays of light onto a photosensitive area 55, then the photosite covered by lenslet 51 is 2 stops faster than the location 52. In this case, the lenslet 51 is used for fast photosites and no lenslet is used for slow photosites, as represented by location 52.

Figure 4:
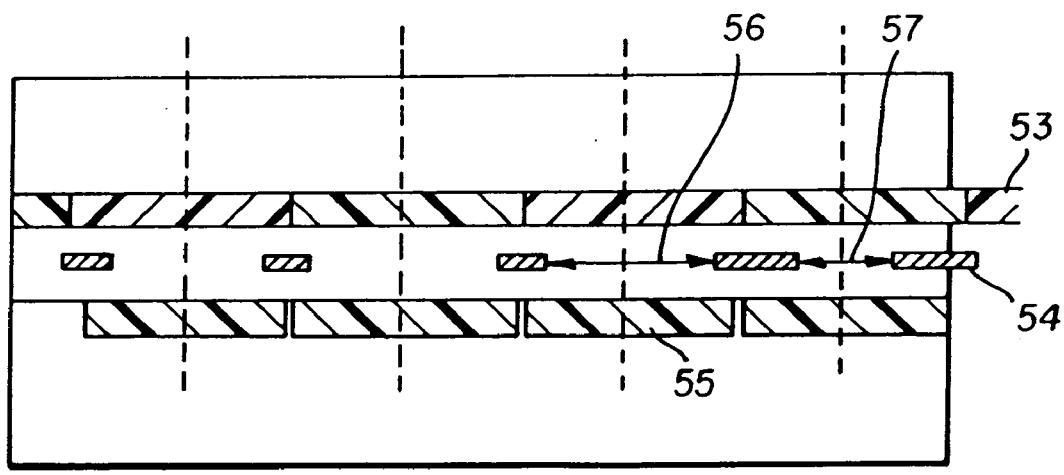
FIG. 4 is a cross-sectional view of a full frame image sensing device employing a metal mask to alter the response of selected photosites.

With reference to FIG. 4 showing a cross section of a full frame image sensing device 10, in the case where the image sensing device 10 is a full frame device, light rays incident to the photosensitive area 55 of a photosite must pass through an aperture of a light shield, typically made from metal, which is shown in cross-section in FIG. 4 to comprise light blocking mask portions 54 and large and small apertures 56 and 57 interspersed among the light blocking portions. In the preferred embodiment, the gain of photosites may be altered by modifying the light blocking mask portion 54. The sensitivity of the photosite is then directly related to the aperture of the light blocking mask portion 54. For example, one photosite with an aperture 50% of the size of a second photosite's aperture will have a response of 50% compared to that on the second photosite. For example, a large aperture 56 of a light blocking mask portion 54 allows 80% of the light rays incident upon that photosite to pass through, but a small aperture 57 allows only 20% of the incident light rays to pass. Those skilled in the art will recognize that the photosite with the large aperture 56 is 2 stops faster than a photosite with the small aperture 57. In this case, the large aperture 56 is used for fast photosites, and the small aperture 57 is used for the slow photosites. Thus, the aperture of the light blocking mask may be modified to adjust the response of the selected photosites. The Eastman Kodak Company makes full frame image sensing devices with a metal mask light shield that reduces the pixel active area of all pixels from about 80% to about 20% (for dithered scanner applications where the sensor is moved by ½ the pixel spacing horizontally and vertically, and 4 pictures are taken). The technique thus involves utilizing such mask technology, but with different sized apertures, to provide an image sensor with a differential response to image light.

Figure 5:
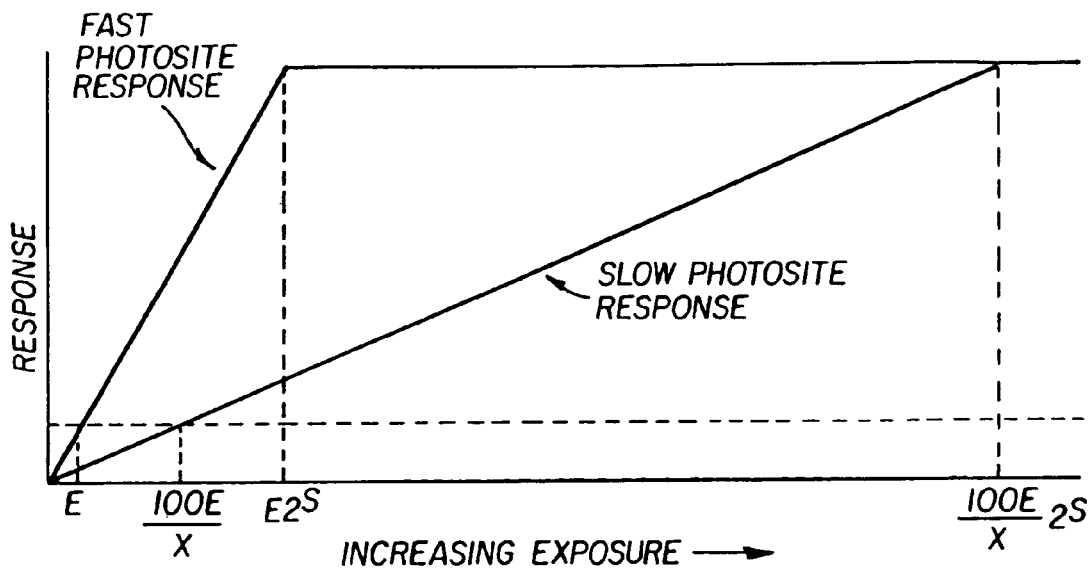
FIG. 5 is a graph illustrating the response of a fast photosite and a slow photosite.

In the preferred embodiment, the response of the selected slow photosites is X% (where X<=100) that of fast photosites for the same exposure, as shown graphically in FIG. 5. In this preferred embodiment, the selected photosites have a response that is slowed by two stops (–log X/100) relative to the fast photosites, resulting in X=25. Thus, the image sensing device 10 consists of multiple sets of photosites, fast photosites and slow photosites. The collection of the output responses of the fast photosites constitutes a sparsely sampled fast digital image, i.e. a sparsely sampled version of a scene sensed with the fast photosites. Likewise, the collection of the output responses of the slow photosites constitutes a sparsely sampled slow digital image, i.e. a sparsely sampled version of a scene sensed with the slow photosites.

Figure 6:
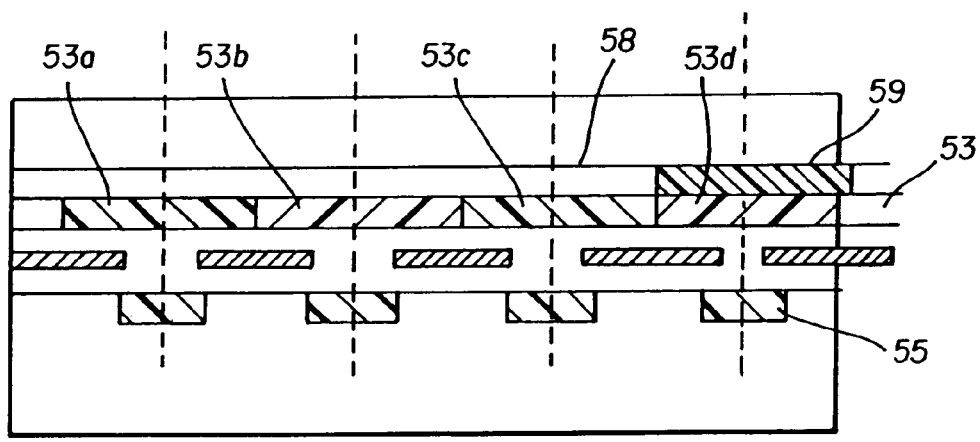
FIG. 6 is a cross-sectional view of an image sensing device employing an array of neutral density filters to alter the response of selected photosites.

As another alternative, the responses of the selected slow photosites can be slowed by the use of a neutral filter coating the photosite. FIG. 6 shows a cross section of an image sensing device with a color filter array 53. Note that the color filter array 53a is red, 53b is green, 53c is red, and 53d is green. A layer of neutral filters 58 is contained above the color filter array 53, although the position of the layer of neutral filters 58 and the color filter array 53 does not matter. Note that the layer of neutral filters 58 only contains a neutral filter at the positions of selected photosites, as indicated by the neutral filter 59. In this case, the layer of neutral filters 58 is transparent or nearly transparent for fast photosites and contains a neutral filter 59 for slow photosites. For example, if the neutral filter 59 consists of a material that allows X% transmission of light, then the response of that slow photosite will be slowed by $$-\log_2\left(\frac{X}{100}\right)$$

stops relative to the response of the fast photosite.

The DREFA processor 22 shown in FIG. 2 is described in more detail hereinbelow. The purpose of the DREFA processor 22 is to create a modified image signal with an increased dynamic range by processing the input image signal while accounting for the difference in photo response of the fast and slow photosites. Accordingly, the output of the DREFA processor 22 is a modified image signal having increased numerical dynamic range. This modified image signal is then input to the CFA interpolator 26 for processing as previously described.

It is not a requirement of the present invention that the A/D converter 14 and the DREFA processor 22 be directly connected. The DREFA processor 22 may reside in hardware or software in close proximity to the A/D converter 14 and image sensing device 10. For example, the DREFA processor 22 could reside directly within a digital camera. However, the DREFA processor 22 may also be remote from the image sensing device 10. For example, the image signal output from the A/D converter 14 can be transmitted (after compression) via a wire or wireless connection to a personal computing device, printer, or remote server to apply to operation of the DREFA processor 22. Transmission of the image signal may also include file transfer protocol or email.

Figures 7A, 7B:
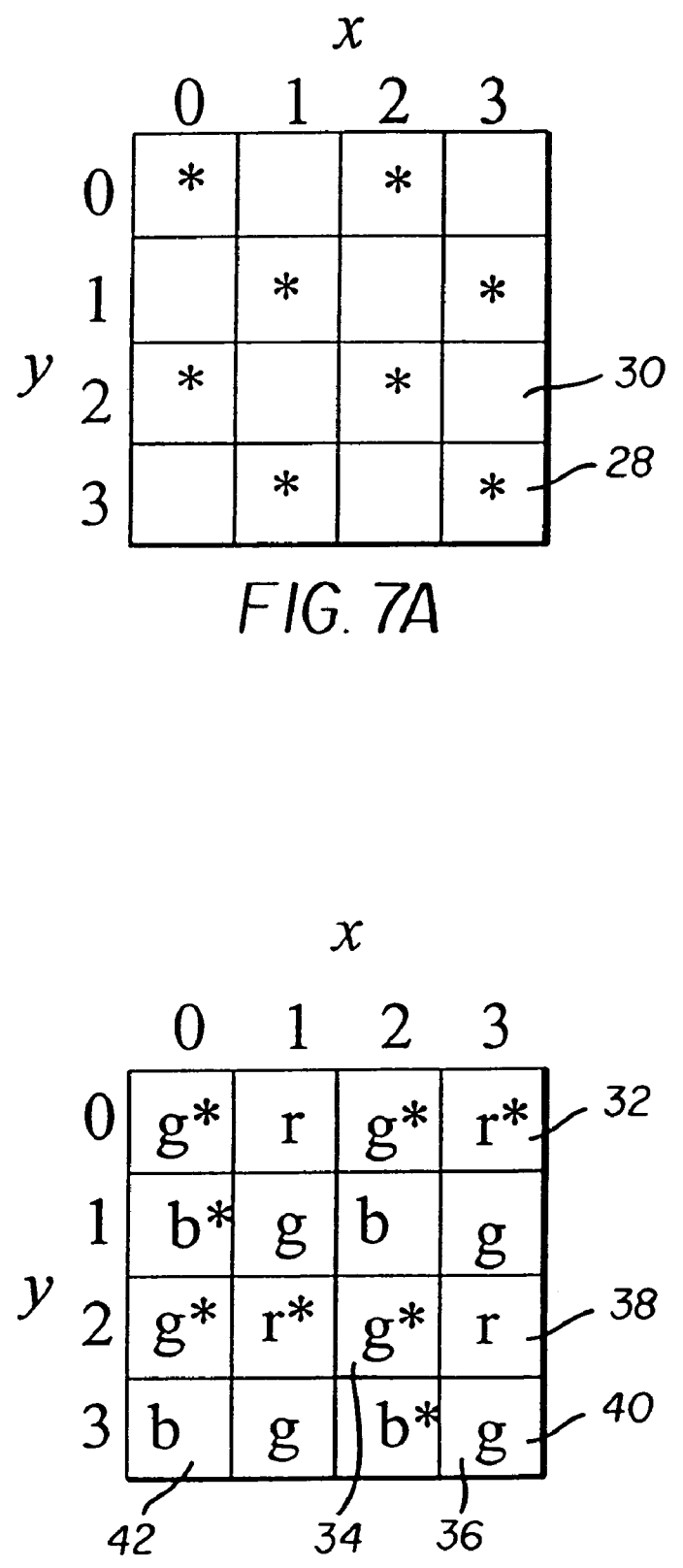

In the preferred embodiment, 50% of the photosites of the image sensing device 10 are selected to have slow response. Those skilled in the art will recognize that the relative percentages of slow and fast pixels is not critical, and that the advantages of the present invention can be achieved with various relative percentages of fast and slow photosites. In the case of an image sensing device 10 in which all photosites have approximately equivalent spectral sensitivity (i.e. a panchromatic image sensing device), FIG. 7A shows an arrangement of the slow photosites that will result in approximately 50% of all the photosites of the image sensing device 10 being of slow response. The photosites 28 with slow response are marked with an asterisk (*), while the photosites 30 having fast response are blank. A sparsely sampled image was previously defined as an image that was captured with an image sensing device 10 having a color filter array. According to the present invention, the term sparsely sampled is also intended to refer to an image produced by an image sensing device such as that shown in FIG. 7A where the fast and slow photosites are interspersed. Additionally, an image sensing device 10 such as shown in FIG. 7A having fast photosites with a predetermined response to light exposure interspersed with slow photosites having a slower response to the same light exposure is a sparsely sampled extended dynamic range image sensing device.

FIG. 7B shows an arrangement for a color image sensing device 10 wherein 50% of each photosite type (red, green, or blue sensitive) has slow response. For example, the photosites 32, 34, and 36 are red, green and blue photosites, respectively, having slow responses; the photosites 38, 40, and 42 are red, green and blue photosites, respectively, having fast responses. Note that the image sensing device 10 is also a sparsely sampled extended dynamic range image sensing device according to the previous definition.

Note that FIGS. 7A and 7B imply a regular pattern for the location of the slow photosites. While it is preferable that the slow photosites are arranged in a regular pattern, it is by no means necessary. The slow photosites could be arranged randomly or semi-randomly over the surface of the image sensing device 10, and their location would be stored in some place accessible to the DREFA processor 22.

Referring to FIG. 5, the response of a fast photosite to a certain exposure and the response of a slow photosite to the same exposure are shown. Note that if a level of noise n is superimposed on the response, it can easily be seen that the fast photosite will yield a valid signal with lower exposures (beginning at exposure level E) than will the slow photosite (which yields valid signal beginning at $$\frac{100}{X}E.)$$

Alternatively, data from the slow photosite will be valid for higher exposure levels (up to signal level of $$\frac{100}{X}E2^S,$$

where S is the inherent dynamic range of a single photosite, typically S may be about 5 stops) than would the fast photosite (which produces valid response up to an exposure of $E2^S$). Note that both the fast photosite and the slow photosite have the same range of response in stops of exposure (S), but the response of the slow photosites is preferably $$-\log_2\left(\frac{X}{100}\right)$$

stops slower than the fast photosites, as shown in FIG. 5. It is preferred that the responses of the fast and slow photosites overlap with respect to exposure. That is, it is preferred that $$-\log_2\left(\frac{X}{100}\right) < S.$$

The overall dynamic range of the image sensing device 10, considering both fast and slow photosites, is $$S - \log_2\left(\frac{X}{100}\right).$$

In the case of the preferred embodiment, where S=5 and X=25, the overall effective dynamic range of the image sensing device 10 is 7 stops of exposure.

The DREFA processor 22 may be utilized to extend the overall dynamic range of the digital images produced with the present invention by using the pixel values corresponding to slow photosites to reconstruct the image signals in regions corresponding to very high exposures. Likewise, the DREFA processor 22 also uses the pixel values corresponding to photosites with fast response to reconstruct the image signal corresponding to very low exposures.

Figure 8:
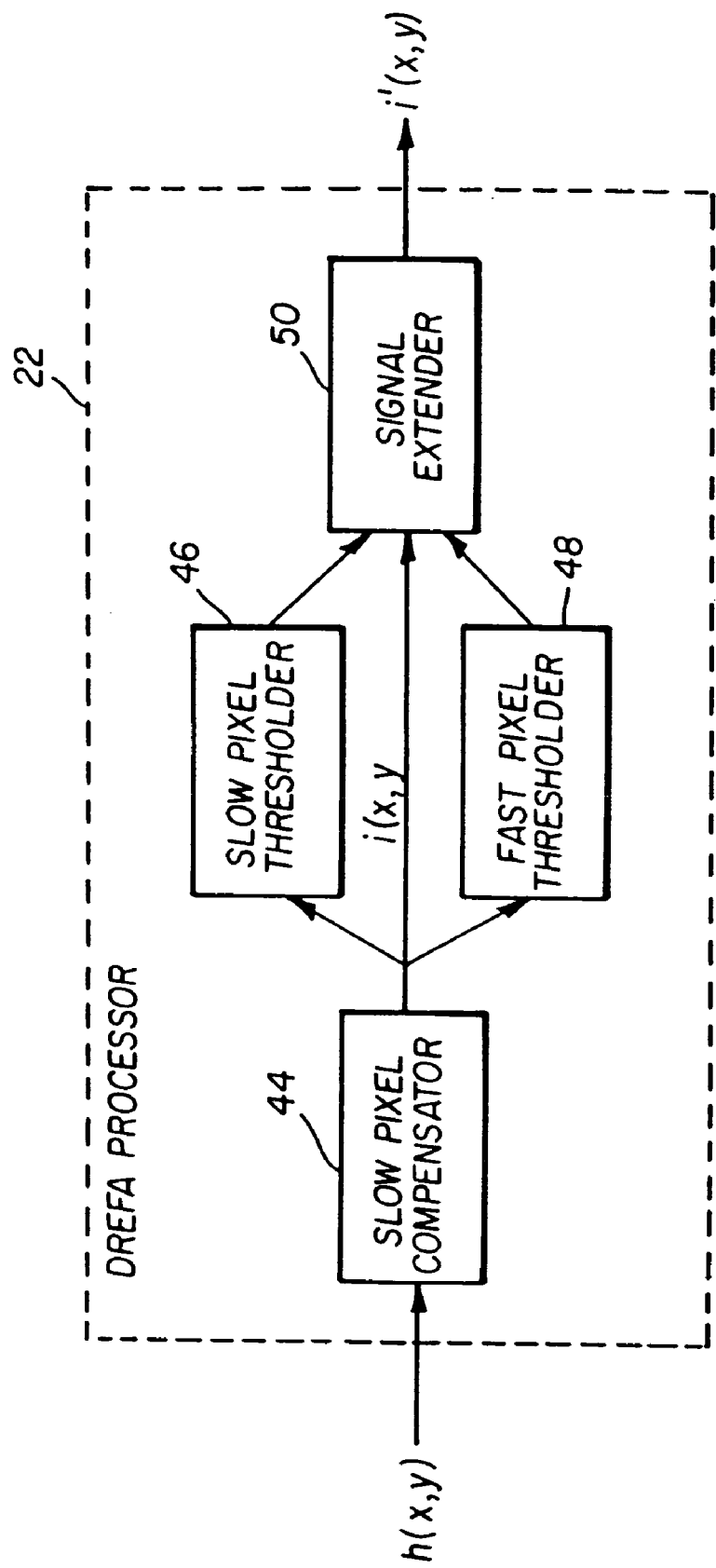
FIG. 8 Shows a block diagram of the dynamic range extending filter array (DREFA) processor.

FIG. 8 shows a block diagram of the DREFA processor 22. The sparsely sampled high resolution digital image, which is a logarithmic image signal b(x,y) output from the A/D converter 14, is passed to the slow pixel compensator 44. The purpose of the slow pixel compensator 44 is to compensate the image signal corresponding to slow photosites by accounting for the offset in response by X stops. Alternatively, the fast pixels can be equalized to the slow pixels by adjusting the fast pixels in the opposite direction. In the preferred embodiment, the image signal corresponding to the slow photosites are incremented by the quantity −cvs log(X/100), where cvs is the number of code values per stop of exposure. In the preferred embodiment, the quantity cvs is 51. Alternatively, if the image signal input to the slow pixel compensator 44 is linearly related to exposure (rather than logarithmically), then the slow pixel compensator 44 scales the image signal corresponding to the slow photosites by a factor of 100/X . Note that it is assumed that the locations of the slow photosites are known to the slow pixel compensator 44. The output of the slow pixel compensator 44 is an image signal i(x,y) that has been compensated at the locations of corresponding to slow photosites for the difference between the slow photosite response in relation to the fast photosite response. At the locations corresponding to fast photosites, the value of the image signal b(x,y) output from the A/D converter 14 is identical to the value of the image signal i(x,y) output from the slow pixel compensator 44. Note that the image signal i(x,y) is not limited to an 8 bit range. In the preferred embodiment, the value of i(x,y) ranges from 0 to 357 (i.e. 9 bits).

Next, the image signal i(x,y) output from the slow pixel compensator 44 is input to a slow pixel thresholder 46. The purpose of the slow pixel thresholder 46 is to determine slow pixel values that are of low quality due to a photosite not receiving enough photons to produce a valid signal. The pixel value at these (x,y) locations is then replaced in processing performed by the signal extender 50 by calculating a new pixel value based upon nearby fast pixel values. All slow pixel values which are less than a predetermined threshold are considered to be problem pixel values. In the case of the slow pixel values, this predetermined threshold is referred to as the low exposure response threshold. Thus, a pixel value i(x,y) is considered to be a problem if it is a slow photosite and if:

$$i(x,y) < T_1 \quad (2)$$

where $T_1$ is predetermined. In the preferred embodiment, the value of $T_1$ is given by $$T_1 = -cvs \, \log_2\left(\frac{X}{100}\right), \quad (3)$$

which in the preferred embodiment is set to a value of 102. Note that the threshold $T_1$ may be dependent upon the color sensitivity of the photosite at location (x,y). Slow pixel values that are problems are referred to as noise pixels, since the value of i(x,y) is not sufficiently above the noise level of the image sensing device to be useful.

Likewise, the image signal i(x,y) output from the slow pixel compensator 44 is input to a fast pixel thresholder 48. The purpose of the fast pixel thresholder 48 is to determine fast pixels that are of low quality. The pixel values at these locations is then replaced by calculating a new pixel value based upon nearby slow pixel values in processing performed by the signal extender 50, which will be described in detail hereinbelow. All fast pixel values that are greater than a predetermined threshold value are considered to be problem pixels. In the case of the fast pixels, this predetermined threshold used for the purpose of detecting problem fast pixels is referred to as the high exposure response threshold. Thus, a fast pixel value i(x,y) is considered to be a problem if:

$$i(x,y) > T_2 \quad (4)$$

where $T_2$ is a predetermined threshold. In the preferred embodiment, the value of $T_2$ is set to a value of 254. Note that the threshold $T_2$ may be dependent upon the color of the photosite at location (x,y). Fast photosites that are problem locations are referred to as saturated pixels, since the value of i(x,y) is as high as possible at these locations.

The (x,y) locations of the problem slow pixels determined by the slow pixel thresholder 46 and the (x,y) locations of the problem fast pixels determined by the fast pixel thresholder 48 are input to the signal extender 50. In addition, the image signal i(x,y) output from the slow pixel compensator 44 is also input to the signal extender 50. The purpose of the signal extender 50 is to replace the image signal i(x,y) values at problem locations (xy) with estimates of the signal herein referred to as replacement values, had the inherent dynamic range of each photosite of the image sensing device 10 been greater. If the problem location is coincident with a slow photosite, then the replacement value is calculated from neighboring image signal pixel values coincident with fast photosites. In this embodiment, the term "neighboring" refers to a certain spatial distance. In the preferred embodiment, the photosites neighboring a selected photosite are those photosites within a distance of 2 photosites of the selected photosite. Likewise, if the problem location is coincident with a fast photosite, then the replacement value is calculated from neighboring image signal values coincident with slow photosites. In the preferred embodiment, the color of the photosite at the problem photosite is also taken into account. The replacement value for any problem location is preferably determined only by the signal originating from neighboring photosites of the same color. The output of the signal extender 50 is an image signal i'(x,y) having a dynamic range as if captured by an image sensing device 10 having photosites with inherent dynamic range of $$S = -\log_2\left(\frac{X}{100}\right) \quad (5)$$

rather than the actual inherent dynamic range of S for each photosite of the image sensing device 10. Note that for all (x,y) locations that are not problem locations, the value of i'(x,y) is equivalent to i(x,y).

As an example of the processing performed by the signal extender 50 for the Bayer CFA pattern shown in FIG. 7B, if location (x,y) is a problem location, and (x,y) is the location that corresponds to a green photosite (such as photosite 34 in FIG. 7B), then the replacement value i'(x,y) for the image signal i(x,y) is calculated in the following manner:

$$i'(x,y) = 0.25 * [i(x-1,y-1) + i(x+1,y-1) + i(x-1,y+1) + i(x+1,y+1)] \quad (6)$$

Note that signal values that the calculation of i'(x,y) is dependent upon, are expected to comply with certain requirements. For example, suppose that (x,y) is a problem location and (x,y) corresponds to a green photosite with slow response. Then the signal levels of neighboring photosites are used to calculate replacement value i'(x,y). However, this assumes that the signal values of each of the neighboring photosites are also less than $T_3$. In the preferred embodiment, $T_3 = T_1$. For each neighboring photosite that this is not the case, that signal level is omitted from the calculation of the replacement value i'(x,y). For example, if i(x-1, y-1) > $T_3$, then the value i'(x,y) is calculated with the following formula:

$$i'(x,y) = \frac{1}{3} * [i(x+1,y-1) + i(x-1,y+1) + i(x+1,y+1)] \quad (7)$$

Generally, the interpolation scheme for determining a replacement value at problem location (x,y), where the location (x,y) corresponds to a green photosite which is also a fast photosite on a image sensing device having a Bayer pattern filter array is given with the following equation:

$$i'(x, y) = \frac{\sum_{j=-1,1} \sum_{k=-1,1} i(x+j, y+k) W(x+j, y+k)}{\sum_{j=-1,1} \sum_{k=-1,1} W(x+j, y+k)} \quad (8)$$

where $$W(x+j, y+k) = \begin{cases} 1 & i(x+j, y+k) > T_3 \\ 0 & \text{otherwise} \end{cases} \quad (9)$$

Note that the same equation is applied to determine the replacement value if the problem location corresponds to a green photosite which is also a slow photosite. However, in this case:

$$W(x+j, y+k) = \begin{cases} 1 & i(x+j, y+k) > T_4 \\ 0 & \text{otherwise,} \end{cases} \quad (10)$$

where in the preferred embodiment, $T_4 = T_2$.

As another example, also in connection with the Bayer CFA pattern shown in FIG. 7B, if location i(x,y) is a problem photosite and (x,y) corresponds to a location of a red or blue photosite, then the replacement value i'(x,y) for the image signal i(x,y) is calculated in the following manner:

$$i(x,y) = 0.25 * [i(x-2,y) + i(x+2,y) + i(x,y+2) + i(x,y-2)]. \quad (11)$$

When location (x,y) corresponds to a red or blue photosite and is also a fast photosite, the equation for determining the replacement value i'(x,y) may be generalized as follows:

$$i'(x, y) = \frac{\sum_{j=-2,0}\sum_{k=-2,0,2} i(x+j, y+k)W(x+j, y+k)}{\sum_{j=-2,0,2}\sum_{k=-2,0,2} W(x+j, y+k)} \quad (12)$$

where $$W(x+j, y+k) = \begin{cases} 1 & i(x+j, y+k) > T_3 \\ 0 & \text{otherwise} \end{cases} \quad (13)$$

Note that in this case, either j or k must be 0, but j and k are never both zero. Note also that the same equation is applied to determine the replacement value if the problem location corresponds to a red or blue photosite which is also a slow photosite. However, in this case $$W(x+j, y+k) = \begin{cases} 1 & i(x+j, y+k) > T_4 \\ 0 & \text{otherwise,} \end{cases} \quad (14)$$

where in the preferred embodiment, $T_4=T_2$.

The interpolation scheme described above for the purpose of generating an image signal with an extended dynamic range from more than one sparsely sampled image signal may be modified by those skilled in the art. However, many such modifications to the above interpolation scheme may be derived and should not be considered as significant deviations of the present invention.

Those skilled in the art will recognize that the above interpolation scheme performed by the signal extender is a lowpass filter, which is well known in the art. Typically, the application of a lowpass filter to an image signal has a similar effect to reducing the resolution of the image signal. Thus, the processing performed by the DREFA processor 22 is a method by which the spatial resolution of the image sensing device 10 may be traded for dynamic range of the image sensing device 10. Indeed, those areas of an image where the interpolation scheme is implemented to increase the dynamic range of the signal appear noticeably softer (less sharp) than the image would have if that same area of the image had been captured by the image sensing device in such a fashion that no "problem locations" occur (as defined by the slow pixel thresholder 46 and the fast pixel thresholder 48).

Figure 9:
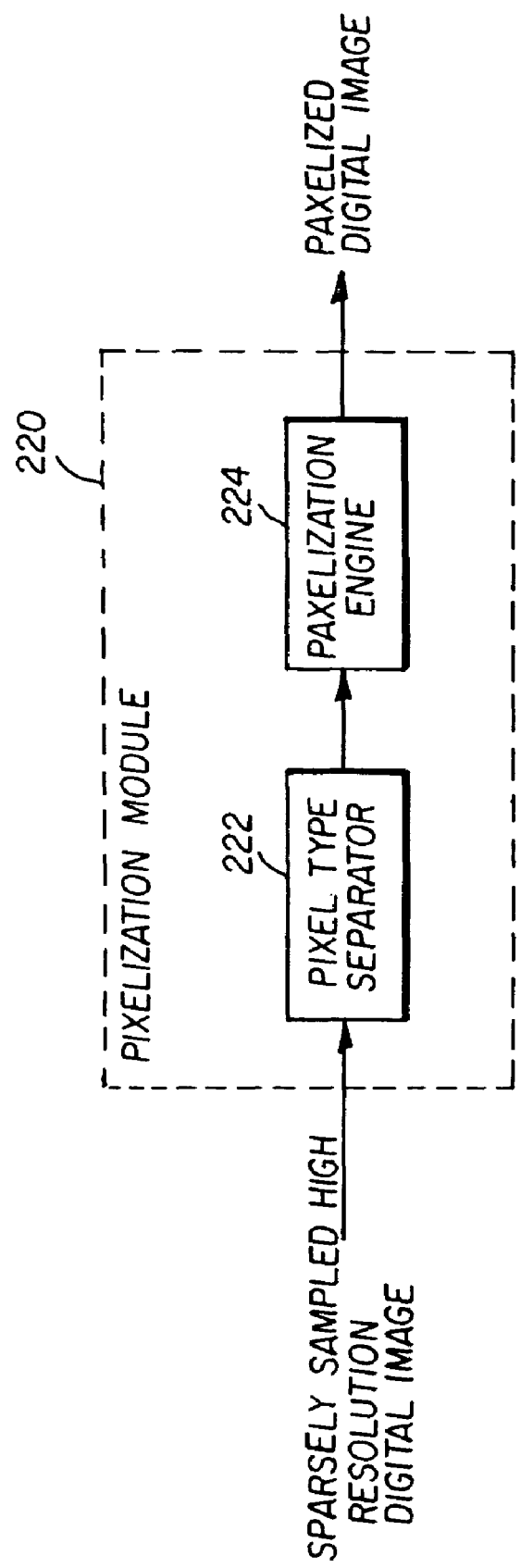
FIG. 9 Shows a block diagram of the paxelization module.
Figure 10:
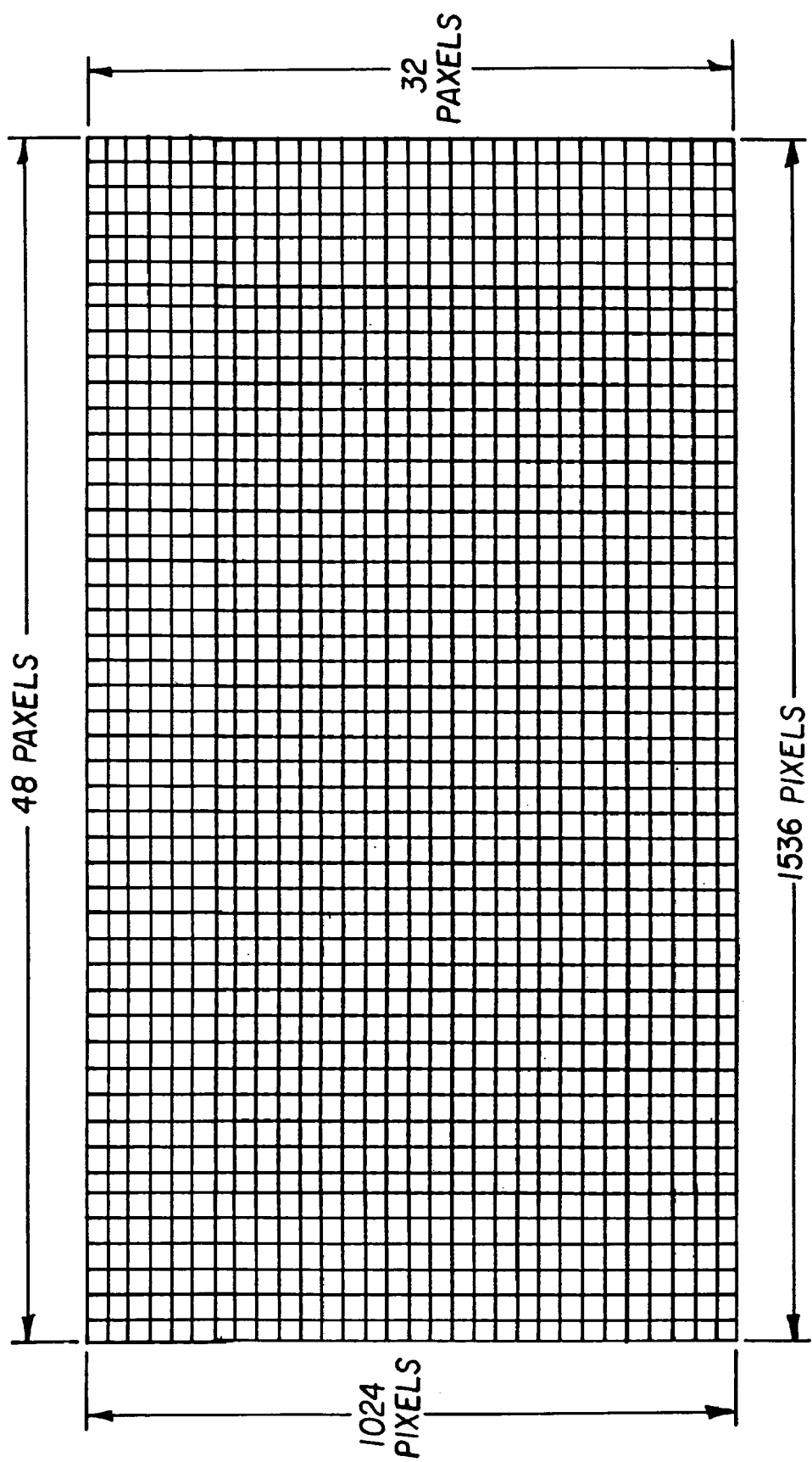
FIG. 10 shows an example of the arrangement of pixels for block averaging.

The paxelization module 220 shown in FIG. 2 is illustrated in more detail in FIG. 9. The purpose of the paxelization module 220 is to create a paxelized digital image for the purpose of analysis by algorithms in order to determine density and color balance and determine a desired tone scale function by the enhancement processor 240 as will be described in detail hereinbelow. The paxelization module 220 receives an image signal from the A/D converter 14. The image signal is received by the pixel type separator 222. The purpose of the pixel type separator 222 is to allow access to each type of pixel separately. In the present invention, the photosites are of two types, fast or slow as shown in FIG. 7A in the case of a monochromatic image sensing device 10. Furthermore in the case of the color image sensing device 10 as shown in FIG. 7B, within each category, the photosite may also be red, green, or blue. (Those skilled in the art will recognize that many other color and speed combinations are possible.) Thus there are a total of six types of photosites. In this embodiment, the pixel type separator 222 separately outputs all the fast pixel values and all the slow pixel values. The paxelization engine 224 receives the slow pixel values and performs a numerical averaging spatial filtering technique which results in a paxelized digital image. In the preferred embodiment, the paxelization engine 224 utilizes block averaging with block size N×N in order to create the paxelized digital image which is output from the paxelization module 220. For example, if a block size of N=32 pixels is used by the paxelization engine 224, then when the sparsely sampled high resolution digital image has a resolution of 1024×1536, then the paxelized digital image will have a resolution of 32×48 as illustrated in FIG. 10. Typically the value of N is selected such that the paxelized digital image is of small size, such as is used by color and tone analysis algorithms. Each pixel of the paxelized digital image corresponds to a N×N block of the sparsely sampled high resolution digital image. Each pixel value of the paxelized digital image has associated pixel value for each color of the digital image, typically red, green, and blue. The red pixel values of the paxelized digital image are determined by the paxelization engine 224 by averaging all of the red pixel values within the corresponding N×N block of the sparsely sampled high resolution digital image. Notice that since in the preferred embodiment the pixel type separator 222 outputs only slow pixel values, each pixel of the paxelized digital image will be calculated exclusively with slow pixel values. A similar process is followed for the green and the blue pixel values.

It is important to note that the action taken by pixel type separator 222 does not have to rearrange the storage of the pixel data in computer memory. The present invention implements the pixel type separator 222 as a pointer addressing scheme to the storage of the pixel data in computer memory. Thus the most important aspect of the pixel type separator 222 is capability of indexing pixel data corresponding to the fast photosites and slow photosites as a separate entities.

An alternative embodiment of the pixel type separator 222 generates a paxelized image having only a single pixel value at each pixel location. This pixel value can be thought of as a luminance pixel value. The luminance pixel values of the paxelized digital image can be obtained by using only the slow green pixel values within the corresponding N×N block of the sparsely sampled high resolution digital image. Alternatively, luminance pixel values may be derived by using all of the slow pixel values within the corresponding N×N block of the sparsely sampled high resolution digital image. As a further alternative embodiment illustrated in FIG. 2, the paxelization module 220 may use similar techniques to generate a paxelized digital image from the image signal output from the DREFA processor 22 or from the full resolution digital image output from the CFA interpolator 26.

The low resolution module 232 shown in FIG. 2 creates a low resolution digital image for the purpose of allowing a user to interactively determine balance and tone scale function modifications by allowing the user to specify desired tone scale adjustments. The user inputs these desired tone scale adjustments with the user selection device 62, shown in FIG. 1. The operation of the low resolution module 232 (see FIG. 2) is similar to the paxelization module 220 except that the factor of N is generally selected so the low resolution image is appropriate for the display device 64. Generally, the factor of N for the low resolution module 232 is greater than the factor of N for the paxelization module 220. In the preferred embodiment, the factor of N used to generate the low resolution digital image is 8. If the display device 64 is a color display device, then the low resolution digital image should have more than one color pixel value for each pixel location. Alternatively, if the display device 64 is not a color display device, then the low resolution digital image may have only a single luminance pixel value as previously described.

Figure 11:
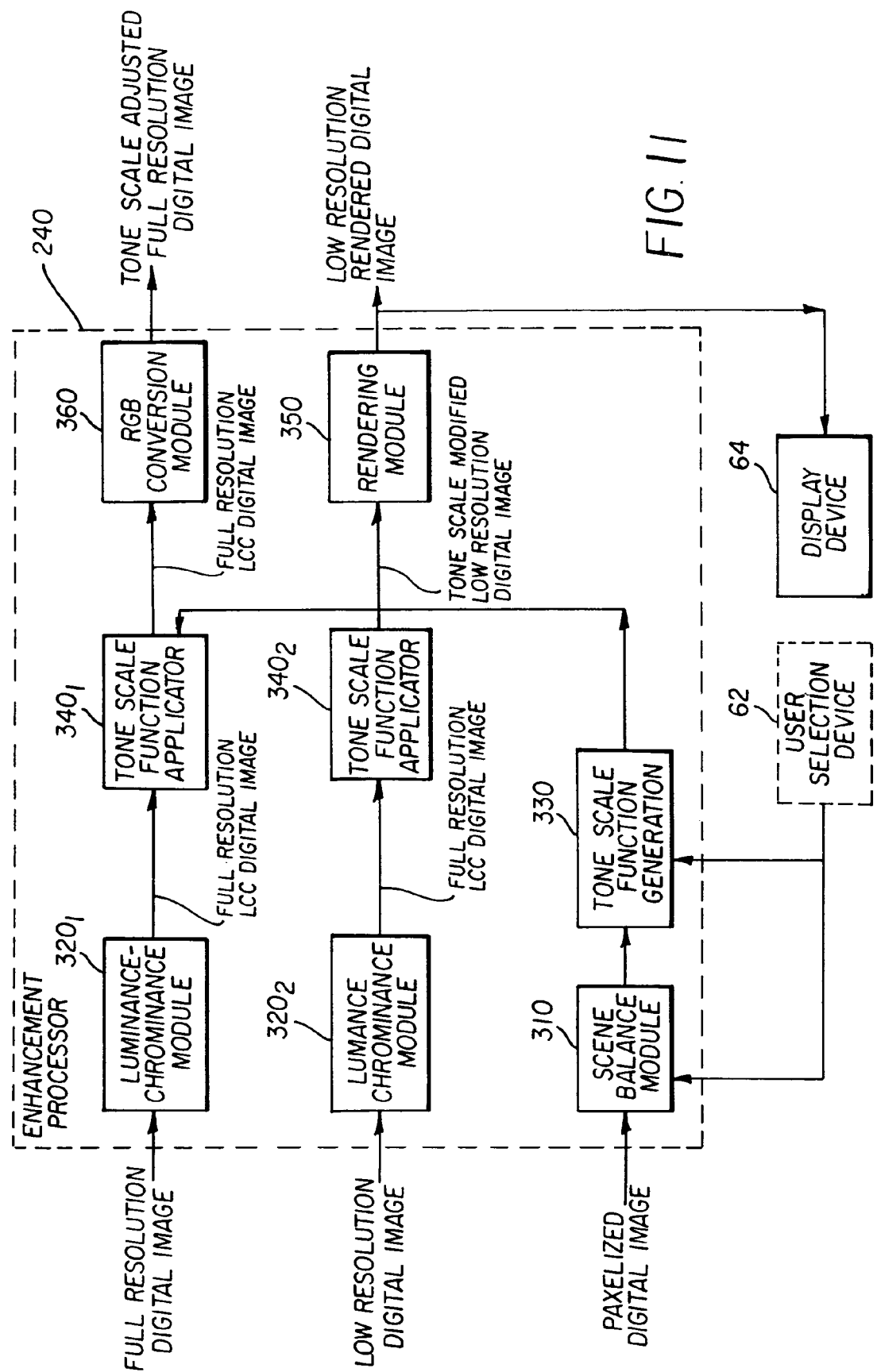
FIG. 11 is a functional block diagram the enhancement processor.

The enhancement module 240 shown in FIG. 2 is illustrated in more detail in FIG. 11. The full resolution digital image output from the CFA interpolator 26 is input to the enhancement processor. In an alternative embodiment, the position of the enhancement processor 24 may be placed in from of the CFA interpolator 26 or the DREFA processor 22.

The luminance-chrominance module $320_1$ receives the full resolution digital image and generates a full resolution LCC digital image. The luminance-chrominance module $320_2$ receives the low resolution digital image and generates a low resolution LCC digital image. In applications such as monochrome imaging, the luminance chrominance module 320 may be omitted.

The scene balance module 310 receives the paxelized digital image and calculates balance parameters which relate to an overall in color and brightness change to be imparted to final processed digital image. The paxelized digital image and the balance parameters are received by the tone scale function generator 330 which calculates a lightness tone scale function, i.e. a single valued function used for transforming pixel values. The tone scale function applicator $340_2$ receives the lightness tone scale function and the low resolution LCC digital image and applies the lightness tone scale function to the low resolution LCC digital image to produce a tone scale modified low resolution digital image. The tone scale modified low resolution digital image represents an extended dynamic range digital image which has been balanced for brightness and color and had its tone scale adjusted to improve shadow and highlight detail. The tone scale modified low resolution digital image is received by the rendering module 350 which produces a low resolution rendered digital image. The process of converting the color values captured by an image sensing device to those appropriate for display on a particular output device is often referred to as "rendering". The low resolution rendered digital image is then displayed on a display device 64 for the purpose of gathering user feedback. The user inputs desired changes to the tone scale function using a user selection device 62 such as a button, mouse, touch screen, slider, voice commands, or other methods of inputting the desired tone scale adjustments. As an example of the desired tone scale adjustments, the user indicates by way of the user selection device 62 that the highlights of the image on the display device 64 should be darkened. The scene balance module 310 and the tone scale function generator 330 then generate modified balances and tone scale functions, respectively. Making image balance and tone scale dependent on user interaction is well known in the art. For example, U.S. Pat. No. 5,012,333 issued Apr. 30, 1991 to Lee et al. entitled Interactive Dynamic Range Adjustment System for Printing Digital Images describes an interactive method for setting then applying an image dependent tone scale function. The tone scale function applicator $340_2$ receives the modified tone scale function and the low resolution LCC digital image and applies the modified tone scale function to the low resolution LCC digital image to produce a tone scale modified low resolution digital image. Note that several methods exist for applying a tone scale function to a digital image and will be described in greater detail hereinbelow. After rendering by the rendering module 350, the low resolution rendered digital image is displayed to the display device 64 in order to allow the user to make further adjustments with the user selection device 62. This process may repeat itself until the user has no further adjustments. In that case, the tone scale function applicator $340_1$ applies the tone scale function (or the modified tone scale function in the case where the user makes no adjustments) to the full resolution LCC digital image in order to produce a tone sale adjusted full resolution LCC digital image. The RGB conversion module 360 converts this LCC digital image back to an image represented with red, green, and blue pixel values to produce a tone scale adjusted full resolution digital image.

In an alternative embodiment, in some applications such as high speed applications, the display device 64 and user selection device 62 may be omitted. In this case, the low resolution digital image need not be created, and the tone scale function output from the tone scale function generator 330 is applied to the full resolution LCC digital image by the tone scale function applicator $340_1$.

The luminance-chrominance module $320_1$ is used to generate a full resolution LCC digital image from the full resolution digital image. The full resolution digital image includes red, green, and blue digital image channels. Each digital image channel contains the same number of pixels. Let $R_{ij}$, $G_{ij}$, and $B_{ij}$ refer to the pixel values corresponding to the red, green, and blue digital image channels located at the $i^{th}$ row and $j^{th}$ column. Let $L_{ij}$, $C1_{ij}$, and $C2_{ij}$ refer to the transformed pixel values of the modified digital image. The 3 by 3 matrix transformation relating the input and output pixel values is as follows:

$$L_{ij} = \tau_{11}R_{ij} + \tau_{12}G_{ij} + \tau_{13}B_{ij}$$

$$C1_{ij} = \tau_{21}R_{ij} + \tau_{22}G_{ij} + \tau_{23}B_{ij}$$

$$C2_{ij} = \tau_{31}R_{ij} + \tau_{32}G_{ij} + \tau_{33}B_{ij} \quad (15)$$

where the $\tau_{mn}$ terms are the coefficients of the 3 by 3 LCC matrix denoted by $[\tau]$. The constants employed by the present invention for $\tau_{11}$, $\tau_{12}$ and $\tau_{13}$ are 0.333, 0.333 and 0.333 respectively. It is important to note that the present invention may be practiced with other luminance chrominance transformations and still yield good results. For example, a matrix with $\tau_{11}$, $\tau_{12}$ and $\tau_{13}$ values set to 0.30, 0.59, and 0.11 respectively also works well. The calculated values C1 and C2 are examples of digital color difference values. The luminance-chrominance module $320_2$ is also used to generate, in identical manner, a low resolution LCC digital image.

The paxelized digital image output from the paxelization module 220 is input to the scene balance module 310. The present invention may be practiced with any scene balance module 310 such as the one described in U.S. Pat. No. 4,945,406 issued Jul. 31, 1990 to Cok entitled Apparatus and Accompanying Methods for Achieving Automatic Color Balancing in a Film to Video Transfer System. The scene balance module calculates balance parameters, i.e. pixel values corresponding to the pixel values of theoretical 18% gray card, based on the pixel values of the paxelized digital image. In the method taught by Cok, statistical parameters are calculated from the pixels of the paxelized digital image such as pixel minimum, maximum and average values. These statistical parameters are calculated for different regions of the paxelized digital image and for three color digital image channels (L, C1 and C2). The statistical parameters are combined in a multilinear equation with predetermined coefficients to predict three balance parameters, i.e. an L channel balance parameter relating to the overall image brightness and two chrominance balance parameters for the C1 and C2 digital image channels which relate to the overall color balance of the image. Note that these color balance values, although expressed in terms of L, C1 and C2 may be easily converted to other color spaces (e.g. red, green, and blue) by techniques commonly known to those in the field of color science.

The tone scale function generator 330 receives the paxelized digital image and calculates a tone scale function, i.e. a single valued mathematical equation or transformation that has a single output value corresponding to each input value. The present invention implements the lightness tone scale function as a look-up-table for computation efficiency. The present invention may be practiced with a variety of methods which generate tone scale functions. The preferred embodiment of the present invention uses the methods disclosed in U.S. Pat. No. 4,731,671 issued Mar. 15, 1988 to Alkofer entitled Contrast Adjustment in Digital Image Processing Method Employing Histogram Normalization and U.S. Pat. No. 5,822,453, referenced above. These methods are employed by the present invention to produce two individual tone scale functions. These two tone scale functions are then cascaded into single lightness tone scale function which is used to adjust the brightness and contrast of the LCC digital image.

In U.S. Pat. No. 5,822,453, Lee et al. disclose a method of calculating a tone scale function using the pixel values of a digital image involving estimating the scene contrast from the digital image. The method taught by Lee et al. involves calculating a Laplacian filtered version of the digital image, forming a histogram of the Laplacian signal, determining from the Laplacian histogram, two threshold values which when applied to the Laplacian signal substantially eliminate uniform areas; sampling pixels from the digital image which are based on the thresholds; forming a histogram from the sampled pixels; computing a standard deviation of the sampled histogram; and estimating contrast of the digital image by comparing the computed standard deviation with a predetermined contrast for determining contrast of the input image in relationship with the predetermined contrast. The method described by Lee and Kwon is used to calculate a first tone scale function.

In U.S. Pat. No. 4,731,671, Alkofer discloses a method of calculating a tone scale function using the pixel values of digital image based on normalizing the histogram of a digital image. This method involves determining the contrast of the digital image by calculating the standard deviation of a sample of pixel values. The second tone scale function is calculated by normalizing a histogram of the sample of pixels values. The sample of pixel values is selected from one of a plurality of samples of pixel values corresponding to a plurality of contrast intervals based upon the shape of the histogram of the selected sample of pixel values. To facilitate the adjustment of contrast, the tone scale function is constructed to produce values in units of a standard normal variate Z. These Z values are then multiplied by a constant which is a function of the standard deviation of the sample of pixel values to determine the contrast of the processed digital image. The present invention uses the L (luminance) digital image channel of the LCC paxelized digital image as a base for analysis of the second tone scale function.

The first and second tone scale functions are combined into a lightness tone scale function using the mathematical formula:

$$LUT_f[j]=LUT_1[LUT_2[j]] \quad (16)$$

where $LUT_2$ represents the second tone scale function, $LUT_1$ represents the first tone scale function, and $LUT_f$ represents the lightness tone scale function. The j variable represent the index of pixel values of the digital image to be processed. The lightness tone scale function $LUT_f$ is calculated by evaluating the expression of equation (16) for the range of possible pixel values.

The lightness tone scale function $LUT_f$ and the LCC digital image are received by the tone scale function applicator 340$_1$, and 340$_2$. The present invention applies the lightness tone scale function to the luminance channel of the full resolution LCC digital image and the low resolution LCC digital image respectively to adjust the brightness and contrast attributes of the source digital image. Applying the lightness tone scale function directly to the L (luminance) channel of the LCC digital image is the fasted method. However, the present invention may be practiced with other methods of applying the lightness tone scale function to the pixels of a digital image. For example, an alternative embodiment is described in U.S. Ser. No. 09/163,645 filed Sep. 30, 1998 by Gallagher et al. Alternatively, commonly assigned U.S. Pat. No. 5,012,333 also describes a method of applying a tone scale function to a digital image. These methods involve spatially filtering the luminance digital image channel resulting in two spatial frequency components (high and low components), applying the tone scale function to the low spatial frequency component, and combining the tone scale modified low spatial frequency component with the high spatial frequency component. The resulting processed digital image has enhanced brightness and contrast attributes with improved spatial detail content. Both of these methods utilize spatial filters in order to apply the tone scale function.

The RGB conversion module 360 receives tone sale adjusted full resolution LCC digital image and transforms the luminance-chrominance representation back to a red-green-blue channel representation with the application of a linear 3 by 3 matrix transform. The resulting digital image channels of the tone scale adjusted full resolution digital image have the same color metric representation as the source digital image. The transformation generates new pixel values as linear combinations of the input color pixel values.

Let $L_{ij}$, $C1_{ij}$, and $C2_{ij}$ refer to the pixel values corresponding to the luminance and two chrominance digital image channels located at the $i^{th}$ row and $j^{th}$ column. Let $R'_{ij}$, $G'_{ij}$, and $B'_{ij}$ refer to the transformed pixel values of the modified digital image. The 3 by 3 matrix transformation relating the input and output pixel values is as follows:

$$R'_{ij}=\eta_{11}L_{ij}+\eta_{12}C1_{ij}+\eta_{13}C2_{ij}$$

$$G'_{ij}=\eta_{21}L_{ij}+\eta_{22}C1_{ij}+\eta_{23}C2_{ij}$$

$$B'_{ij}=\eta_{31}L_{ij}+\eta_{32}C1_{ij}+\eta_{33}C2_{ij} \quad (17)$$

where the $\eta_{mn}$ terms are the coefficients of the 3 by 3 matrix transformation.

The preferred embodiment of the present invention constructs the rgb conversion matrix denoted by $[\eta]$ above as the inverse of the lcc matrix denoted by $[\tau]$ corresponding to the luminance-chrominance module 320. This is mathematically represented in matrix notation in equation (18).

$$[\eta]=[\tau]^{-1} \quad (18)$$

The rendering module 350 shown in FIG. 11 receives tone scale modified low resolution digital image, applies a transform to the pixel values, and produces a low resolution rendered digital image that is directly viewable on a display device. Two transforms are used to prepare the tone scale modified low resolution digital image for direct viewing. The first transform is a 3×3 color matrix transformation which is applied to the color pixels of the tone scale modified low resolution digital image. The color matrix transformation accounts for the difference between the spectral sensitivities of the color photosites of the image sensing device 10 and the spectral characteristics of the display device 64. The method described above employed by the present invention is similar to the method taught and disclosed in U.S. Pat. No. 5,189,511 issued Feb. 23, 1993 to Parulski et al. entitled Method and Apparatus for Improving the Color Rendition of Hardcopy Images from Electronic Cameras. The second transform involves the application of a tone scale function which maps the extended dynamic range pixel values of the tone scale modified low resolution digital image to pixel values compatible with typical viewing devices. The present invention uses a similar method to the one described in U.S. Pat. No. 5,300,381 issued Apr. 5, 1994 to Buhr et al. entitled Color Image Reproduction of Scenes with Preferential Tone Mapping. Buhr describes a method of calculating a rendering tone scale function with preferential tone mapping in which the contrast of the tone scale function is greatest for midtone pixel intensities and has gracefully lower contrast for shadow and highlight pixel intensities. This rendering tone scale function is combined with a gamma mapping tone scale function to calculate a system tone scale function. The gamma mapping tone scale function compensates for the inherent intensity response of typical viewing devices. The system tone scale function is cascaded with the rendering tone scale function and applied, in the form of a look-up-table, to the pixels of the tone scale modified low resolution digital image resulting in a low resolution rendered digital image.

For digital camera applications, a display device 64 such as an LCD screen is used to view digital images produced by the digital image processor 200. For other digital imaging applications the user can also view digital images on a display device 64. The user views the image presented on the LCD display device and can make selections with regard to the brightness, color and tone. The changes to the brightness and color are input to the scene balance module 310 as shown in FIG. 11. The present invention uses the modifications selected by the user to make additive changes to the balance parameters. Those skilled in the art of color balance technology will recognize that the present invention can be practiced with a wide variety of different methods for achieving color balance.

A tone scale function for a sparsely sampled extended dynamic range digital image can also be generated using the steps of: a) providing a sparsely sampled extended dynamic range image sensing device having fast photosites with a predetermined response to light exposure interspersed with slow photosites with a slower response to the same light exposure; b) using the image sensing device to produce a sparsely sampled high resolution digital image having fast pixel values produced by the fast photosites and slow pixel values produced by the slow photosites; c) analyzing the fast pixel values for saturation; and d) if saturation is present in the fast pixel values, generating the tone scale function using only slow pixel values from the sparsely sampled high resolution digital image, otherwise, using only fast pixel values.

The invention has been described in detail with particular reference to certain preferred embodiments thereof, but it will be understood that variations and modifications can be effected within the spirit and scope of the invention.

PARTS LIST 2 lens
6 optical lowpass filter
10 image sensing device
14 A/D converter
22 DREFA processor
26 CFA interpolator
28 slow photosite
30 fast photosite
32 red slow photosite
34 green slow photosite
36 blue slow photosite
38 red fast photosite
40 green fast photosite
42 blue fast photosite
44 slow pixel compensator
46 slow pixel thresholder
48 fast pixel thresholder
50 signal extender
51 standard lenslet
52 location
53a–d color filter array
54 light blocking mask portion
55 photosensitive area
56 large aperture
57 small aperture
58 neutral density filter layer
59 neutral density filter
62 user selection device
64 display device
200 digital image processor
220 paxelization module
222 pixel type separator
224 paxelization engine
232 low resolution module
240 enhancement processor
310 scene balance module
$320_1$ luminance-chrominance module
$320_2$ luminance-chrominance module
330 ton scale function generator
$340_1$ tone scale applicator
$340_2$ tone scale applicator
350 rendering module
360 RGB conversion module

What is claimed is:

1. A method of generating a tone scale function for a sparsely sampled extended dynamic range digital image, comprising the steps of:
   a) providing a sparsely sampled extended dynamic range image sensing device having fast photosites with a predetermined response to light exposure interspersed with slow photosites with a slower response to the same light exposure;
   b) using the image sensing device to produce a sparsely sampled high resolution digital image having fast pixel values produced by the fast photosites and slow pixel values produced by the slow photosites; and
   c) generating the tone scale function using only slow pixel values from the sparsely sampled high resolution digital image.

2. The method claimed in claim 1, further comprising the step of:
   d) applying the tone scale function to the sparsely sampled high resolution digital image to produce a tone scale adjusted sparsely sampled high resolution digital image.

3. The method claimed in claim 2, further comprising the step of:
   e) generating a full resolution digital image from the tone scale adjusted sparsely sampled high resolution digital image to produce a tone scale adjusted full resolution digital image.

4. A computer program product for generating a tone scale function for a sparsely sampled extended dynamic range digital image, the computer program product comprising computer readable storage medium having a computer program stored thereon for performing the steps of claim 3.

5. A computer program product for generating a tone scale function for a sparsely sampled extended dynamic range digital image, the computer program product comprising computer readable storage medium having a computer program stored thereon for performing the steps of claim 2.

6. The method claimed in claim 1, further comprising the steps of:
   d) generating a full resolution digital image from the sparsely sampled high resolution digital image; and
   e) applying the tone scale function to the full resolution digital image to produce a tone scale adjusted full resolution digital image.

7. The method claimed in claim 6, further comprising the step of applying a spatial filter to the full resolution digital image.

8. A computer program product for generating a tone scale function for a sparsely sampled extended dynamic range digital image, the computer program product comprising computer readable storage medium having a computer program stored thereon for performing the steps of claim 7.

9. A computer program product for generating a tone scale function for a sparsely sampled extended dynamic range digital image, the computer program product comprising computer readable storage medium having a computer program stored thereon for performing the steps of claim 6.

10. The method claimed in claim 1, wherein the image sensing device is a color image sensing device having differently colored photosites for producing color pixel values and wherein the slow pixel values from only one color of photosite are used to generate the tone scale function.

11. The method claimed in claim 10, wherein the different colors are red, green, and blue and wherein only green pixel values are used to generate the tone scale function.

12. A computer program product for generating a tone scale function for a sparsely sampled extended dynamic range digital image, the computer program product comprising computer readable storage medium having a computer program stored thereon for performing the steps of claim 11.

13. A computer program product for generating a tone scale function for a sparsely sampled extended dynamic range digital image, the computer program product comprising computer readable storage medium having a computer program stored thereon for performing the steps of claim 10.

14. The method claimed in claim 1, wherein the image sensing device is a color image sensing device having differently colored photosites for producing color pixel values and further comprising the step of:
   d) constructing slow luminance pixel values from the different colored slow pixel values; and
   e) using the slow luminance pixel values to generate the tone scale function.

15. A computer program product for generating a tone scale function for a sparsely sampled extended dynamic range digital image, the computer program product comprising computer readable storage medium having a computer program stored thereon for performing the steps of claim 14.

16. The method claimed in claim 1, further comprising the steps of:
   d) forming a paxelized digital image from the slow pixel values; and
   e) using the paxelized digital image to generate the tone scale function.

17. A computer program product for generating a tone scale function for a sparsely sampled extended dynamic range digital image, the computer program product comprising computer readable storage medium having a computer program stored thereon for performing the steps of claim 16.

18. The method claimed in claim 1, further comprising the steps of:
   d) generating a low resolution digital image from the sparsely sampled high resolution digital image;
   e) applying the tone scale function to the low resolution digital image to form a tone scale modified low resolution digital image;
   f) displaying the tone scale modified low resolution digital image;
   g) specifying a desired tone scale adjustment of modified low resolution digital image; and
   h) employing the specified tone scale adjustment to generate an adjusted tone scale function.

19. A computer program product for generating a tone scale function for a sparsely sampled extended dynamic range digital image, the computer program product comprising computer readable storage medium having a computer program stored thereon for performing the steps of claim 16.

20. The method claimed in claim 1, wherein the method is performed in a digital camera.

21. A computer program product for generating a tone scale function for a sparsely sampled extended dynamic range digital image, the computer program product comprising computer readable storage medium having a computer program stored thereon for performing the steps of claim 16.

22. The method claimed in claim 1, wherein the image sensing device is a color image sensing device having differently colored photosites for producing color pixel values and wherein a tone scale function is generated for each color.

23. The method claimed in claim 22, further comprising the steps of:
   d) generating a full resolution digital image from the sparsely sampled high resolution digital image; and
   e) applying the tone scale functions to the full resolution digital image to produce a tone scale adjusted full resolution digital image.

24. A computer program product for generating a tone scale function for a sparsely sampled extended dynamic range digital image, the computer program product comprising computer readable storage medium having a computer program stored thereon for performing the steps of claim 23.

25. A computer program product for generating a tone scale function for a sparsely sampled extended dynamic range digital image, the computer program product comprising computer readable storage medium having a computer program stored thereon for performing the steps of claim 22.

26. A computer program product for generating a tone scale function for a sparsely sampled extended dynamic range digital image, the computer program product comprising computer readable storage medium having a computer program stored thereon for performing the steps of claim 1.

27. A method of generating a tone scale function for a sparsely sampled extended dynamic range digital image, comprising the steps of:
 a) providing a sparsely sampled extended dynamic range image sensing device having fast photosites with a predetermined response to light exposure interspersed with slow photosites with a slower response to the same light exposure;
 b) using the image sensing device to produce a sparsely sampled high resolution digital image having fast pixel values produced by the fast photosites and slow pixel values produced by the slow photosites;
 c) analyzing the fast pixel values for saturation; and
 d) if saturation is present in the fast pixel values, generating the tone scale function using only slow pixel values from the sparsely sampled high resolution digital image.

28. The method claimed in claim 27, further comprising the step of:
 e) applying the tone scale function to the sparsely sampled high resolution digital image to produce a tone scale adjusted sparsely sampled high resolution digital image.

29. The method claimed in claim 28, further comprising the step of:
 f) generating a full resolution digital image from the tone scale adjusted sparsely sampled high resolution digital image to produce a tone scale adjusted full resolution digital image.

30. A computer program product for generating a tone scale function for a sparsely sampled extended dynamic range digital image, the computer program product comprising computer readable storage medium having a computer program stored thereon for performing the steps of claim 29.

31. A computer program product for generating a tone scale function for a sparsely sampled extended dynamic range digital image, the computer program product comprising computer readable storage medium having a computer program stored thereon for performing the steps of claim 28.

32. The method claimed in claim 27, further comprising the steps of:
 e) generating a full resolution digital image from the sparsely sampled high resolution digital image; and
 f) applying the tone scale function to the full resolution digital image to produce a tone scale adjusted full resolution digital image.

33. The method claimed in claim 32, further comprising the step of applying a spatial filter to the full resolution digital image.

34. A computer program product for generating a tone scale function for a sparsely sampled extended dynamic range digital image, the computer program product comprising computer readable storage medium having a computer program stored thereon for performing the steps of claim 33.

35. A computer program product for generating a tone scale function for a sparsely sampled extended dynamic range digital image, the computer program product comprising computer readable storage medium having a computer program stored thereon for performing the steps of claim 32.

36. The method claimed in claim 27, wherein the image sensing device is a color image sensing device having differently colored photosites for producing color pixel values and wherein the pixel values from only one color of photosite are used to generate the tone scale function.

37. The method claimed in claim 36, wherein the different colors are red, green, and blue and wherein only green pixel values are used to generate the tone scale function.

38. A computer program product for generating a tone scale function for a sparsely sampled extended dynamic range digital image, the computer program product comprising computer readable storage medium having a computer program stored thereon for performing the steps of claim 37.

39. A computer program product for generating a tone scale function for a sparsely sampled extended dynamic range digital image, the computer program product comprising computer readable storage medium having a computer program stored thereon for performing the steps of claim 36.

40. The method claimed in claim 27, wherein the image sensing device is a color image sensing device having differently colored photosites for producing color pixel values and further comprising the step of:
 e) constructing luminance pixel values from the different colored pixel values, and
 f) using the luminance pixel values to generate the tone scale function.

41. A computer program product for generating a tone scale function for a sparsely sampled extended dynamic range digital image, the computer program product comprising computer readable storage medium having a computer program stored thereon for performing the steps of claim 40.

42. The method claimed in claim 27, further comprising the steps of:
 e) forming a paxelized digital image from the pixel values; and
 f) using the paxelized digital image to generate the tone scale function.

43. A computer program product for generating a tone scale function for a sparsely sampled extended dynamic range digital image, the computer program product comprising computer readable storage medium having a computer program stored thereon for performing the steps of claim 42.

44. The method claimed in claim 27, further comprising the steps of:
 e) generating a low resolution digital image from the sparsely sampled high resolution digital image;
 f) applying the tone scale function to the low resolution digital image to form a tone scale modified low resolution digital image;
 g) displaying the tone scale modified low resolution digital image;
 h) specifying a desired tone scale adjustment of modified low resolution digital image; and i) employing the specified tone scale adjustment to generate an adjusted tone scale function.

45. A computer program product for generating a tone scale function for a sparsely sampled extended dynamic range digital image, the computer program product comprising computer readable storage medium having a computer program stored thereon for performing the steps of claim 44.

46. The method claimed in claim 27, wherein the method is performed in a digital camera.

47. A computer program product for generating a tone scale function for a sparsely sampled extended dynamic range digital image, the computer program product comprising computer readable storage medium having a computer program stored thereon for performing the steps of claim 46.

48. The method claimed in claim 27, wherein the image sensing device is a color image sensing device having differently colored photosites for producing color pixel values and wherein a tone scale function is generated for each color.

49. The method claimed in claim 48, further comprising the steps of:
   e) generating a full resolution digital image from the sparsely sampled high resolution digital image; and
   f) applying the tone scale functions to the full resolution digital image to produce a tone scale adjusted full resolution digital image.

50. A computer program product for generating a tone scale function for a sparsely sampled extended dynamic range digital image, the computer program product comprising computer readable storage medium having a computer program stored thereon for performing the steps of claim 49.

51. A computer program product for generating a tone scale function for a sparsely sampled extended dynamic range digital image, the computer program product comprising computer readable storage medium having a computer program stored thereon for performing the steps of claim 48.

52. A computer program product for generating a tone scale function for a sparsely sampled extended dynamic range digital image, the computer program product comprising computer readable storage medium having a computer program stored thereon for performing the steps of claim 27.

53. A system for generating a tone scale function for a sparsely sampled extended dynamic range digital image, comprising:
   a) a sparsely sampled extended dynamic range image sensing device having fast photosites with a predetermined response to light exposure interspersed with slow photosites with a slower response to the same light exposure for producing a sparsely sampled high resolution digital image having fast pixel values produced by the fast photosites and slow pixel values produced by the slow photosites; and
   b) means for generating the tone scale function using only slow pixel values from the sparsely sampled high resolution digital image.

54. The system claimed in claim 53, further comprising:
   c) means for applying the tone scale function to the sparsely sampled high resolution digital image to produce a tone scale adjusted sparsely sampled high resolution digital image.

55. The system claimed in claim 53, further comprising:
   d) means for generating a full resolution digital image from the tone scale adjusted sparsely sampled high resolution digital image to produce a tone scale adjusted full resolution digital image.

56. The system claimed in claim 53, further comprising:
   c) means for generating a full resolution digital image from the sparsely sampled high resolution digital image; and
   d) means for applying the tone scale function to the full resolution digital image to produce a tone scale adjusted full resolution digital image.

57. The system claimed in claim 56, further comprising means for applying a spatial filter to the full resolution digital image.

58. The system claimed in claim 53, wherein the image sensing device is a color image sensing device having differently colored photosites for producing color pixel values and wherein the slow pixel values from only one color of photosite are used to generate the tone scale function.

59. The system claimed in claim 58, wherein the different colors are red, green, and blue and wherein only green pixel values are used to generate the tone scale function.

60. The system claimed in claim 53, wherein the image sensing device is a color image sensing device having differently colored photosites for producing color pixel values and further comprising:
   c) means for constructing slow luminance pixel values from the different colored slow pixel values; and
   d) means for using the slow luminance pixel values to generate the tone scale function.

61. The system claimed in claim 53, further comprising:
   c) means for forming a paxelized digital image from the slow pixel values; and
   d) means for using the paxelized digital image to generate the tone scale function.

62. The system claimed in claim 53, further comprising:
   c) means for generating a low resolution digital image from the sparsely sampled high resolution digital image;
   d) means for applying the tone scale function to the low resolution digital image to form a tone scale modified low resolution digital image;
   e) means for displaying the tone scale modified low resolution digital image;
   f) means for specifying a desired tone scale adjustment of modified low resolution digital image; and
   g) means for employing the specified tone scale adjustment to generate an adjusted tone scale function.

63. The system claimed in claim 53, wherein the system is in a digital camera.

64. The system claimed in claim 53, wherein the image sensing device is a color image sensing device having differently colored photosites for producing color pixel values and wherein a tone scale function is generated for each color.

65. The system claimed in claim 64, further comprising:
   c) means for generating a full resolution digital image from the sparsely sampled high resolution digital image; and
   d) means for applying the tone scale functions to the full resolution digital image to produce a tone scale adjusted full resolution digital image.

66. A system for generating a tone scale function for a sparsely sampled extended dynamic range digital image, comprising:

a) a sparsely sampled extended dynamic range image sensing device having fast photosites with a predetermined response to light exposure interspersed with slow photosites with a slower response to the same light exposure for producing a sparsely sampled high resolution digital image having fast pixel values produced by the fast photosites and slow pixel values produced by the slow photosites;
b) means for analyzing the fast pixel values for saturation; and
c) means for generating the tone scale function using only slow pixel values from the sparsely sampled high resolution digital image if saturation is present in the fast pixel values.

67. The system claimed in claim 66, further comprising:
d) means for applying the tone scale function to the sparsely sampled high resolution digital image to produce a tone scale adjusted sparsely sampled high resolution digital image.

68. The system claimed in claim 67, further comprising:
e) means for generating a full resolution digital image from the tone scale adjusted sparsely sampled high resolution digital image to produce a tone scale adjusted full resolution digital image.

69. The system claimed in claim 66, further comprising:
d) means for generating a full resolution digital image from the sparsely sampled high resolution digital image; and
e) means for applying the tone scale function to the full resolution digital image to produce a tone scale adjusted full resolution digital image.

70. The system claimed in claim 69, further comprising means for applying a spatial filter to the full resolution digital image.

71. The system claimed in claim 66, wherein the image sensing device is a color image sensing device having differently colored photosites for producing color pixel values and wherein the pixel values from only one color of photosite are used to generate the tone scale function.

72. The system claimed in claim 71, wherein the different colors are red, green, and blue and wherein only green pixel values are used to generate the tone scale function.

73. The system claimed in claim 66, wherein the image sensing device is a color image sensing device having differently colored photosites for producing color pixel values and further comprising:
d) means for constructing luminance pixel values from the different colored pixel values; and
e) means for using the luminance pixel values to generate the tone scale function.

74. The system claimed in claim 66, further comprising:
d) means for forming a paxelized digital image from the pixel values; and
e) means for using the paxelized digital image to generate the tone scale function.

75. The system claimed in claim 66, further comprising
d) means for generating a low resolution digital image from the sparsely sampled high resolution digital image;
e) means for applying the tone scale function to the low resolution digital image to form a tone scale modified low resolution digital image;
f) means for displaying the tone scale modified low resolution digital image;
g) means for specifying a desired tone scale adjustment of modified low resolution digital image; and
h) means for employing the specified tone scale adjustment to generate an adjusted tone scale function.

76. The system claimed in claim 66, wherein the system is in a digital camera.

77. The system claimed in claim 66, wherein the image sensing device is a color image sensing device having differently colored photosites for producing color pixel values and wherein a tone scale function is generated for each color.

78. The system claimed in claim 77, further comprising:
d) means for generating a full resolution digital image from the sparsely sampled high resolution digital image; and
e) means for applying the tone scale functions to the full resolution digital image to produce a tone scale adjusted full resolution digital image.

* * * * *

UNITED STATES PATENT AND TRADEMARK OFFICE
CERTIFICATE OF CORRECTION

PATENT NO. : 7,068,396 B1  Page 1 of 1
APPLICATION NO. : 09/718991
DATED : June 27, 2006
INVENTOR(S) : Andrew C. Gallagher et al.

It is certified that error appears in the above-identified patent and that said Letters Patent is hereby corrected as shown below:

Column 22, claim 19, line 41     "claim 16" should read --claim 18--

Column 22, claim 21, line 49     "claim 16" should read --claim 20--

Signed and Sealed this

Twenty-seventh Day of February, 2007

JON W. DUDAS
*Director of the United States Patent and Trademark Office*